(12) United States Patent
De Raedt et al.

(10) Patent No.: US 7,205,177 B2
(45) Date of Patent: Apr. 17, 2007

(54) METHODS OF BONDING TWO SEMICONDUCTOR DEVICES

(75) Inventors: Walter De Raedt, Lint (BE); Steven Brebels, Hechtel-Ekstel (BE); Steven Sanders, Roeselare (BE); Tom Torfs, Leuven (BE); Eric Beyne, Leuven (BE)

(73) Assignee: Interuniversitair Microelektronica Centrum (IMEC) (BE)

( * ) Notice: Subject to any disclaimer, the term of this patent is extended or adjusted under 35 U.S.C. 154(b) by 0 days.

(21) Appl. No.: 11/171,483

(22) Filed: Jun. 30, 2005

(65) Prior Publication Data

US 2006/0012037 A1    Jan. 19, 2006

Related U.S. Application Data

(60) Provisional application No. 60/688,908, filed on Jun. 8, 2005, provisional application No. 60/617,761, filed on Oct. 12, 2004, provisional application No. 60/614,840, filed on Sep. 30, 2004.

(30) Foreign Application Priority Data

Jul. 1, 2004    (GB) .................................. 0414739.3
Jun. 8, 2005    (EP) .................................. 05447133

(51) Int. Cl.
*H01L 21/48*    (2006.01)
*H01L 23/48*    (2006.01)
*B23K 31/02*    (2006.01)

(52) U.S. Cl. ...................... 438/108; 438/613; 257/738; 257/778; 257/780; 257/E23.02; 228/180.21; 228/180.22

(58) Field of Classification Search .................... None
See application file for complete search history.

(56) References Cited

U.S. PATENT DOCUMENTS 5,641,113 A  *  6/1997  Somaki et al. ......... 228/180.22

(Continued)

FOREIGN PATENT DOCUMENTS

EP          0 729 182 A2      8/1996

(Continued)

OTHER PUBLICATIONS

Keser et al., "Encapsulated Double-Bump WL-CSP: Design and Reliability," *2001 Electronic Components and Technology Conference*.

(Continued)

*Primary Examiner*—Alonzo Chambliss
(74) *Attorney, Agent, or Firm*—Knobbe Martens Olson & Bear, LLP

(57) ABSTRACT

A method of bonding two elements such as wafers used in microelectronics applications is disclosed. One inventive aspect relates to a method for bonding comprising producing on a first main surface of a first element a first solder ball, producing on a first main surface of a second element a second solder ball, providing contact between the first solder ball and the second solder ball, bonding the first element and the second element by applying a reflow act whereby the solder balls melt and form a joined solder ball structure. Prior to the bonding, the first solder ball is laterally embedded in a nonconductive material, such that the upper part of the first solder ball is not covered by the non-conductive material. Devices related to such methods are also disclosed.

52 Claims, 18 Drawing Sheets

U.S. PATENT DOCUMENTS

| | | | |
|---|---|---|---|
| 5,844,315 A * | 12/1998 | Melton et al. | 257/738 |
| 6,168,972 B1 * | 1/2001 | Wang et al. | 438/108 |
| 6,229,158 B1 | 5/2001 | Minemier et al. | 257/81 |
| 6,425,516 B1 * | 7/2002 | Iwatsu et al. | 228/180.22 |
| 6,555,917 B1 | 4/2003 | Heo | 257/777 |
| 6,664,637 B2 * | 12/2003 | Jimarez et al. | 257/772 |
| 6,787,917 B2 * | 9/2004 | Lee et al. | 257/777 |
| 6,908,784 B1 * | 6/2005 | Farnworth et al. | 438/106 |
| 7,122,906 B2 * | 10/2006 | Doan | 257/778 |
| 2002/0195703 A1 | 12/2002 | Kameda | 257/710 |
| 2005/0017336 A1 * | 1/2005 | Kung et al. | 257/685 |

FOREIGN PATENT DOCUMENTS

| | | |
|---|---|---|
| EP | 0 875 935 A2 | 11/1998 |
| EP | 1 489 657 A1 | 12/2004 |
| JP | 2004265888 | 9/2004 |
| WO | WO99/04430 * | 1/1999 |

OTHER PUBLICATIONS

Beyne, "3D Interconnection and Packaging: 3D-SIP, 3D-SOC or 3D-IC?," IMEC, Belgium.

* cited by examiner

METHODS OF BONDING TWO SEMICONDUCTOR DEVICES

CROSS-REFERENCE TO RELATED APPLICATIONS

This application claims the benefit under 35 U.S.C. § 119(e) of U.S. Patent Application Nos. 60/614,840 filed Sep. 30, 2004, for INTEGRATED ANTENNA FOR WIRELESS RF DEVICES, 60/617,761 filed Oct. 12, 2004, for "WIRELESS COMMUNICATION AND HEALTH MONITORING SYSTEM", and 60/688,908 filed Jun. 8, 2005, for "METHODS FOR BONDING AND DEVICES ACCORDING TO SUCH METHODS", and claims the benefit under 35 U.S.C. § 119(a) of British patent application GB 0414739.3 filed on Jul. 1, 2004, all of which are hereby incorporated by reference.

FIELD OF THE INVENTION

The present invention relates to the field of microelectronics. It relates to methods for bonding two elements, as for instance the bonding of two wafers, dies and dies, or wafer and dies, particularly in the field of 3D-SiP (3-dimensional System in a Package) technologies.

BACKGROUND OF THE INVENTION

In the field of 3-dimensional (3D) stacking of system-in-package (SiP) devices, packages are used with solder ball connections BGA (Ball Grid Array) and CSP (Chip Scale Package)—style connections. Also in other fields, solder balls can be used to provide bonding between two elements.

In order to realize a dense 3D interconnection between such devices, small diameter solder-balls are required. However the diameter has to be larger than the height of the components, which are typically present on the individual SiP layers or elements.

Current RF wireless devices suffer from a large total module thickness or area because of the integration methods used to avoid coupling with the circuits while realizing enough antenna performance (bandwidth, efficiency).

One such device has an integrated antenna placed above circuit. A shielding layer is placed to avoid unwanted coupling between antenna and circuit. The shielding ground plane is part of the integrated antenna. A problem for such a wireless RF device is the thickness of the build-up. The antenna substrate thickness T should be typically larger then 4% of the free space wavelength to obtain enough antenna bandwidth and efficiency, i.e., the antenna substrate alone is several mm's to cm's thick for applications below 10 GHz. The antenna performance (bandwidth and efficiency) can only significantly be improved by increasing the distance between the antenna and the shielding ground plane layer.

Another such device has an integrated antenna placed next to a circuit (e.g., used in several commercial mobile devices including GSM, WLAN cards, etc.). The spacing S between antenna and circuit should be large enough to avoid influence between antenna and circuits. The (shielded) circuits are not considered as part of the antenna structure. A problem for this type of wireless RF device is the area of the build-up. Enough empty space (typically one quarter to half the free space wavelength) should be foreseen between antenna and circuits since the antenna performance can be influenced by the placement of nearby circuit and shielding elements.

SUMMARY OF CERTAIN INVENTIVE ASPECTS

Certain inventive aspects provide a method and corresponding devices for bonding two elements, as for instance the bonding of two SiP layers which can be part of a 3D-stack or multilayer stack, which alleviates or avoids the problems of the prior art.

According to embodiments of the present invention, the solder balls of a first substrate are encapsulated in a polymer resin (e.g., glob-top epoxy or packaging plastic molding compound) and only exposed at the top surface.

The solder ball of the second substrate can then be mounted on the first ball, without the risk of collapse of the solder column or shorting between neighboring solder connections.

For the purpose of the present invention, SiP packages should be understood as packages comprising an interconnect substrate 1 and devices 2 mounted on its surface (see FIG. 1). The thus packaged circuit can realize a system or subsystem functionality. Components can be mounted on both sides of the CSP substrates. These devices can be wire-bonded or flip-chip mounted IC's, standard SMD passives or other components such as clock reference crystals, but also other devices. These components can typically be characterized by having a height above the substrate different from zero and up to several hundreds of micrometer.

The solder balls can have a diameter between about 100 microns and 1 mm. They can, for instance, have a diameter of about 200, 300, 400, 500, 600, 700, 800, or 900 microns. Also smaller or larger solder balls are possible.

In a first aspect of the present invention, a method for bonding is disclosed comprising
  producing on a first main surface of a first element a first solder ball,
  producing on a first main surface of a second element a second solder ball,
  providing contact between the first solder ball and the second solder ball, and
  bonding the first element and the second element by applying a reflow act,
  whereby the solder balls melt and form a joined solder ball structure,
  wherein, prior to the bonding, the first solder ball is laterally embedded in a non-conductive material (called an embedding layer), such that the upper part of the first solder ball is not covered by the non-conductive material.

In certain embodiments, the non-conductive material is laterally embedding the first solder ball up to an embedding level parallel to the first main surface and which does not extend above the first solder ball.

In certain embodiments, applying an underfill/overmold material after the bonding between the first main surface of the second element and the first main surface of the first element can be done.

Also the second solder ball can be laterally embedded in a non-conductive material, such that the upper part of the second solder ball is not covered by the non-conductive material. This non-conductive material is preferably laterally embedding (called an embedding layer) the second solder ball up to an embedding level parallel to the first main surface and which does not extend above the second solder ball.

In certain embodiments, the first main surface of the first element and/or the first main surface of the second element comprise components or structures, whereby the first and the second solder balls are such that the height of the components and/or structures is smaller then the height of the first solder ball and/or the second solder ball respectively. In such an embodiment, the height of the embedding layer(s) should preferably be higher then the height of the components (and of course lower then the respective solder ball height).

In certain embodiments the first main surface of the first element and/or the first main surface of the second element comprise components or structures which have a topology that extends outwards from the respective main surfaces, and whereby the first and the second solder balls are such that the height of at least one of the components and/or structures on the first main surface of the first element and/or the first main surface of the second element is smaller then the height of the joined solder ball structure, but higher than the solder balls on the corresponding main surface. These embodiments can be achieved by providing preformed embedding layers which for instance include exclusion areas (see e.g., FIG. 11, FIG. 13a, b and FIG. 14), or recesses (see e.g., FIG. 12), i.e., areas in which no or only a thinner layer of nonconductive material is present respectively. Such embedding layers which comprise exclusion areas or recesses can be produced by transfer molding or injection molding techniques. Also a glob-top technique whereby a liquid encapsulant is applied can be used. The presence of additional confinement structures 6 (e.g., see FIG. 13), which provide enclosures corresponding to exclusion areas, may be necessary, such that no non-conductive solder ball embedding material can enter the exclusion area. Such confinement structures are not always necessary; molding techniques can also be used which provide exclusion areas. In embodiments whereby exclusion areas are provided on both main surfaces (or similar whereby an embedding layer is only present on one main surface only and comprises an exclusion area), which moreover overlap, and in which on both main surfaces in the respective exclusion area, components are provided, special care should further be taken in the positioning of the components on the first main surfaces, such that components present on the first main surface of a first element are not blocked by components mounted on the first main surface of the second element when both elements are to be bound. This can be achieved by combining lower height components on a first main surface of a first element, with higher height components on a main surface of a second element (e.g., see FIG. 14), or by misaligning the components on the first and second main surfaces on the first and second elements respectively (e.g., see FIG. 11). The combined height of the two components should though be smaller then the joined solder ball structure. It should further be understood that lower and higher components in an exclusion area on a first main surface of a first element can be combined with higher and lower components respectively in an exclusion area on a second main surface of a second element. Such embodiments are shown in FIG. 14.

In other embodiments, there is an applying an underfill/overmold operation, which fills up the remaining gaps between the elements can be applied.

The embodiments of the methods according to the present invention can of course be used repetitively for stacking more then two or three elements.

A method for producing stacked structures is disclosed, wherein methods according to one of the earlier described embodiments is applied an integer number of times, by repetitively bonding a main surface of an element, bonded before by a method according to the present invention, to a main surface of a further element.

In an embodiment wherein more than two elements are stacked, applying an underfill/overmold operation can advantageously be done only once for the whole stacked structure, although this is not strictly necessary.

The elements referred to can be any suitable element known to be usable to a person of ordinary skill in the art, but can for instance be substrates, wafers, chips or dies.

In a second aspect of the present invention devices are disclosed, corresponding to the first aspect of the invention, comprising at least two elements, the elements being bonded by a bonding structure located between a first main surface of a first element and a first main surface of a second element, wherein the bonding structure comprises a solder structure which is essentially a stack of a lower and an upper solder ball, which are forming a single structure.

In certain embodiments, the solder structure is essentially figure 8-shaped; which means that any cross-section of the structure along the longitudinal axis provides an "8" form, i.e., the form of the number "eight". Each of the two loops of this 8-shape then corresponds to a solder ball.

In certain embodiments the lower or/and the upper solder ball(s) is/are laterally embedded in a nonconductive material up to an embedding level which is lower then the height of the top surface of the respective solder balls.

In certain embodiments the first main surface of at least one of the elements comprises at least one component which extends outwards from the first main surface of the corresponding element, and the respective embedding levels are further such that the component(s) are completely covered by the nonconductive material.

The bonding structure can further comprise a layer of underfill/overmold material in between the first main surfaces of the elements.

The invention is further related to a device, wherein the layer of underfill/overmold material is located between a first main surface of one element and an embedding layer on a first main surface of a second element or between the two embedding layers of the two first main surfaces of the two elements respectively.

DESCRIPTION OF THE FIGURES

The FIGS. 1–9 represent methods and devices according to embodiments of the present invention. In FIG. 1 to FIG. 4 embodiments wherein two elements are bonded are illustrated.

FIG. 1 is a diagram showing preparation of the SiP substrate (case of two substrates).

FIG. 2 is a diagram showing principle of the SiP substrate stacking (case of two substrates).

FIG. 4 is a diagram showing principle of the SiP substrate stacking: including bottom-side molding (case of two substrates).

FIG. 5 and FIG. 6 embodiments wherein three or more elements or substrates are bonded are illustrated.

FIG. 5 is a diagram showing preparation of the SiP substrate (case of three or more substrates).

FIG. 7 is a diagram showing alternative preparation of the SiP substrate (case of two substrates).

FIG. 8 is a diagram showing principle of the SiP substrate stacking (alternative case of two substrates).

FIG. 9 is a diagram showing principle of the SiP substrate stacking: using wafer or substrate-level Base wafer (case of three or more substrates, alternative).

FIG. 13a is a side view of two substrates prior to being bonded, and FIG. 13b is a top view of the lower substrate.

DESCRIPTION OF ILLUSTRATIVE EMBODIMENTS

Figure 1:
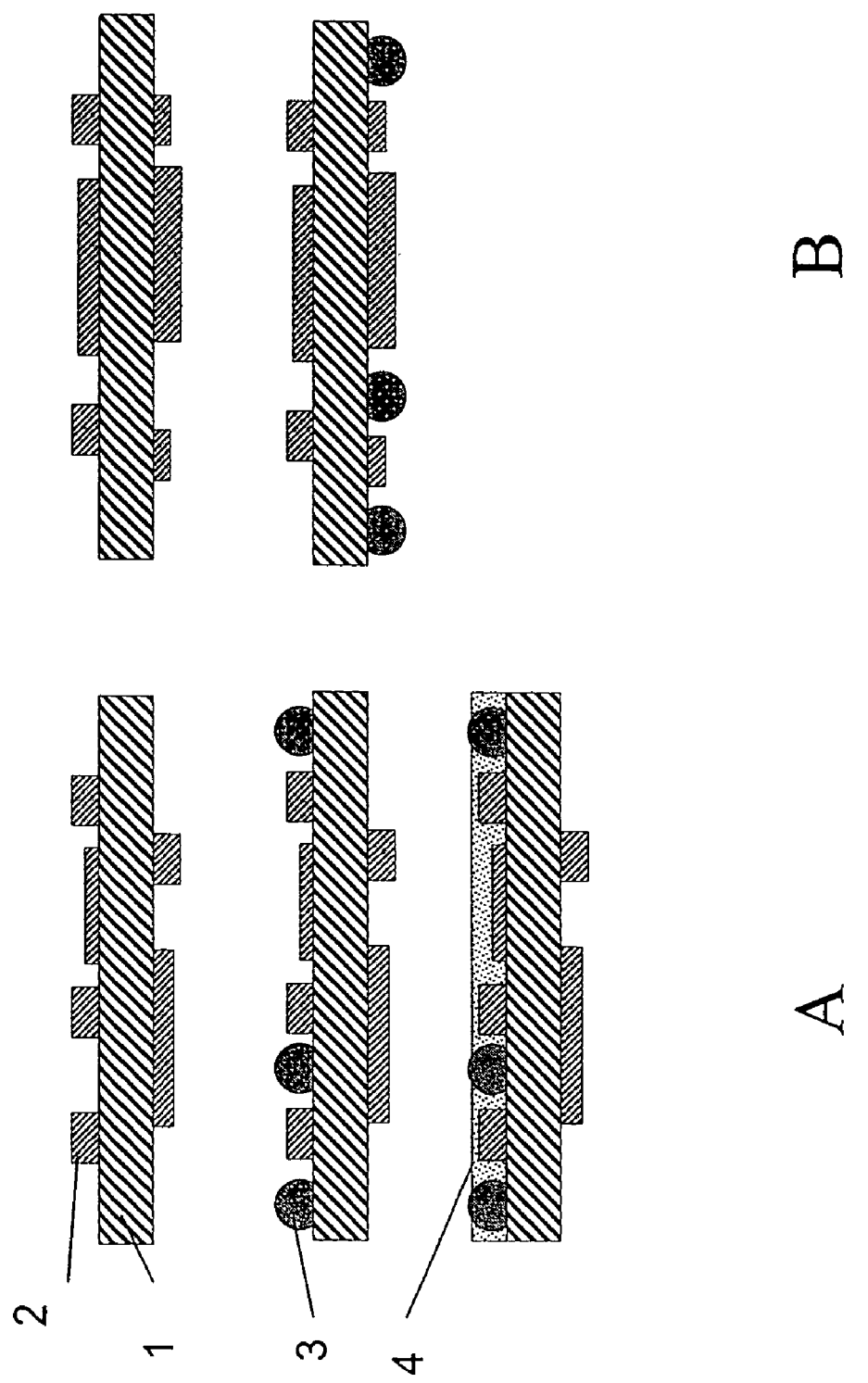

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes. It is to be understood that the terms so used are interchangeable under appropriate circumstances and that the embodiments of the invention described herein are capable of operation in other orientations than described or illustrated herein. The same reference signs in different figures refer to similar elements.

In FIG. 1, the preparation of SiP devices for 3D stacking is illustrated, according to embodiments of the present invention. Sequence A is directed to a bottom substrate and sequence B to a top substrate.

Figure 10:
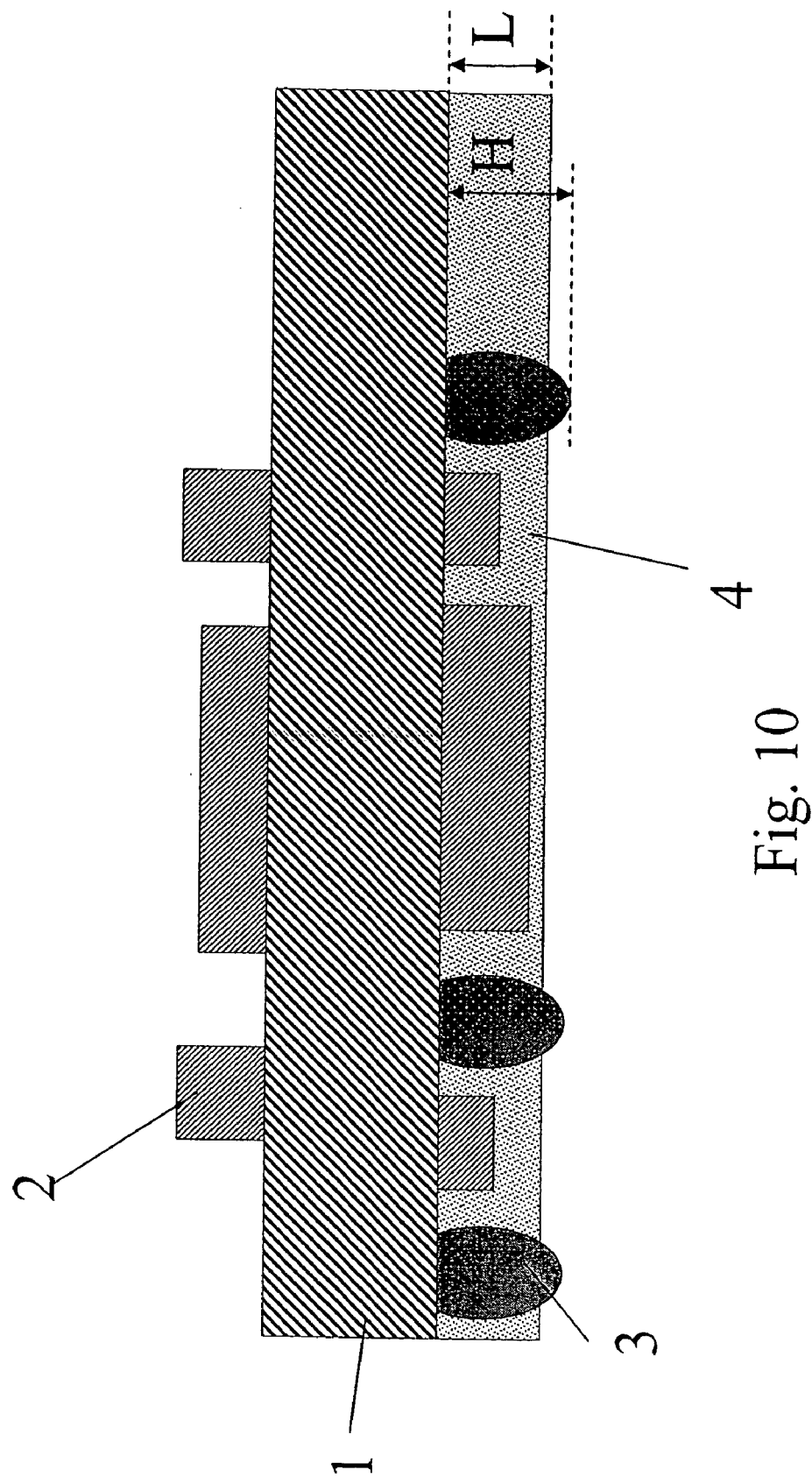
FIG. 10 is a diagram showing a generic representation is given of a solder ball or structure on a first main surface of an element and the height parameter is indicated.

Components 2 are mounted on the elements 1, e.g., substrates or wafers. The component can be any type of surface mount component known to a person of ordinary skill in the art. Such component typically extends outwards of a main surface of the element e.g., substrate. In FIG. 10 the parameters "H"; height and "L"; level are illustrated generically.

Next, solder balls 3 are attached to the top of the bottom substrate and the bottom of the top substrate, using standard BGA and CSP solder ball mounting techniques. In preferred embodiments, pre-formed solder balls are used, placed on the substrate by a collective technique (e.g., stencil printing) and attached to the substrates by reflow soldering.

The attachment may actually be performed simultaneously with the deposition of some of the surface mount components 2 in the prior step. In other embodiments, the solder balls can be individually picked and placed with a fine pitch SMT (surface mount technology) placement machine.

In a next step, the solder balls and surface mounted components on the bottom wafer are encapsulated with a polymer layer 4. The solder balls should however not be completely covered by this layer.

Possible methods are the dispensing of a liquid epoxy 'glob-top' or 'under-fill' type compound that automatically levels and fills all gaps between and below components. Also transfer molding of plastic encapsulation material can be used.

In case the solder balls are covered by a layer thicker than the solder balls, a back grinding step can be used to reduce the thickness of the polymer layer and expose the top surface of the solder balls (a segment of the top of the solder ball will be removed, leaving a approximately flat, typically circular solder area.

Figure 2:
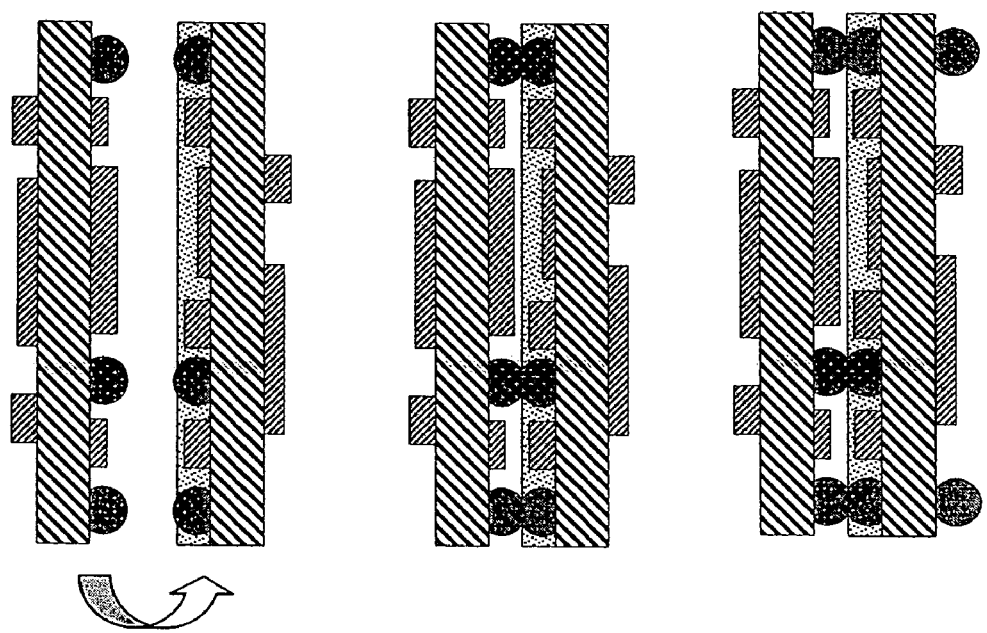

In FIG. 2 the principle of stacking of 2 SiP devices according to embodiments of the present invention is illustrated.

The top substrate SiP is mounted to the base substrate and attached using solder reflow. The distance between the substrates is maintained as the bottom solder ball is not able to collapse during soldering. From a certain viewpoint, the bottom solder balls act as a regular contact pads for the top SiP solder balls.

After reflow, solder balls can be applied to the second main surface of the bottom substrate to finalize the 3D-SiP assembly.

In other embodiments, the solder balls on the second main surface of the bottom substrate can be already present before the reflow step.

Figure 3A:
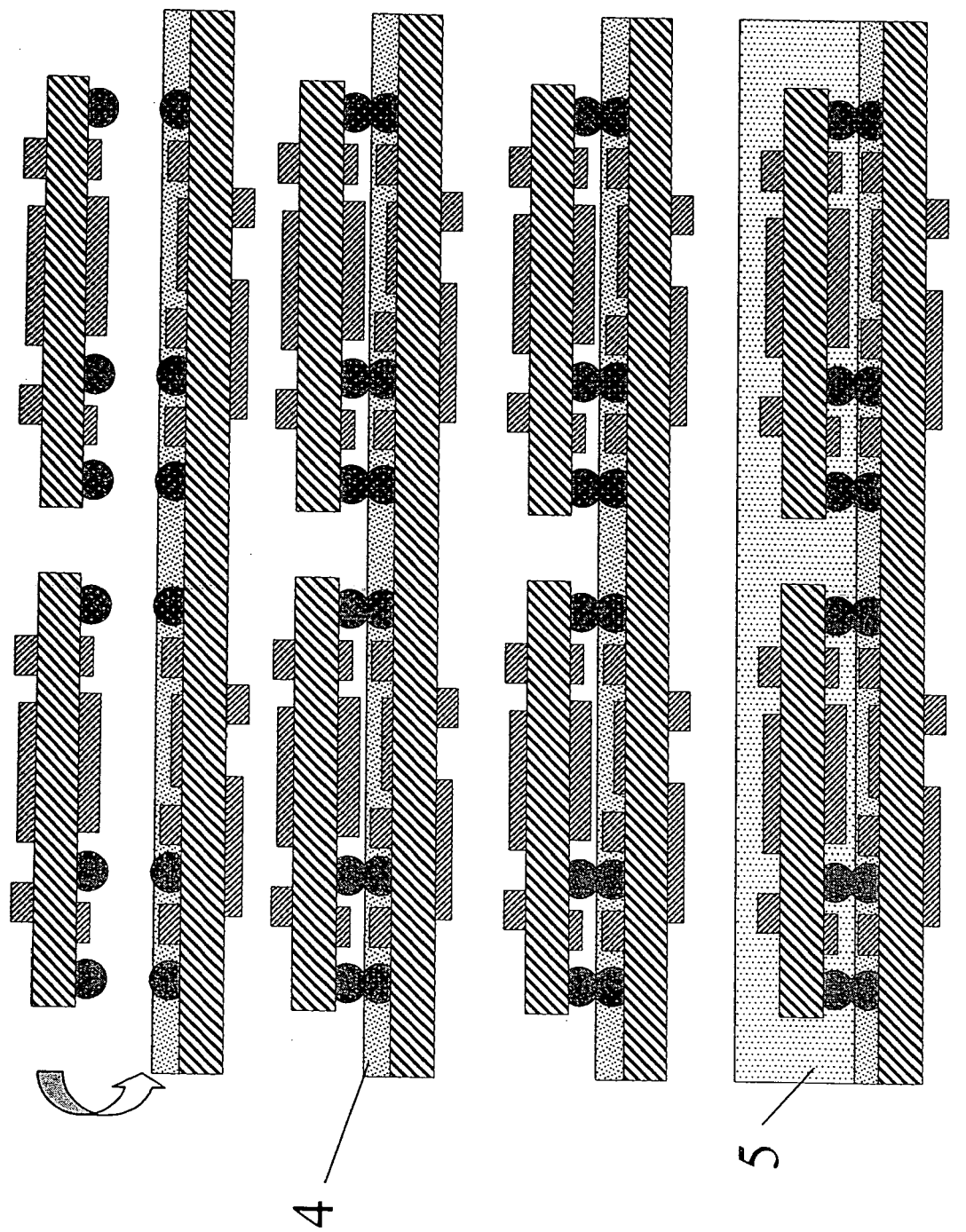
FIG. 3a is a diagram showing principle of the SiP substrate stacking: using wafer or substrate as a basis. (case of two substrates).
Figure 3B:
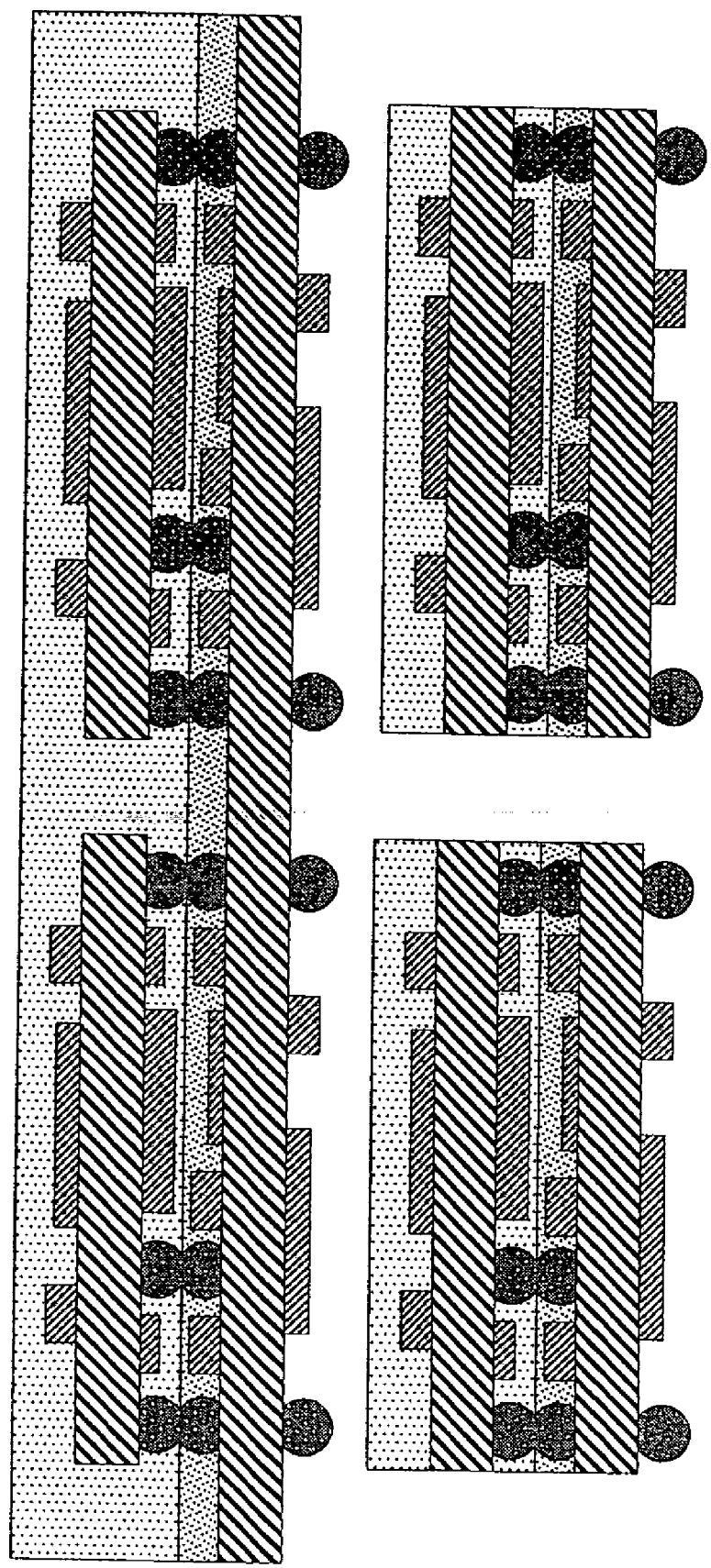
FIG. 3b is a diagram showing principle of the SiP substrate stacking: using wafer or substrates a basis. (case of two substrates).

This step of FIG. 2 may be performed with large substrates with arrays of SiP devices or with singulated and tested SiP substrates, or with singulated and tested SiP devices mounted on tested SiP substrates as shown in FIG. 3a and FIG. 3b. Such testing performed on the devices and substrates can be testing the functioning, the performance, the reliability, etc. of the devices and substrates respectively.

In FIG. 3, embodiments according to the present invention are illustrated, wherein tested SiP devices are stacked on SiP substrates (case of two SiP devices).

This flow is similar as the one of FIG. 2, but here tested known-good SiP are placed on tested known-good SiP sides of the bottom wafer (with 'known-good' is meant "tested with a positive result", and thus properly usable). Defective sites on the bottom substrate can be and are preferably left empty.

Figure 6A:
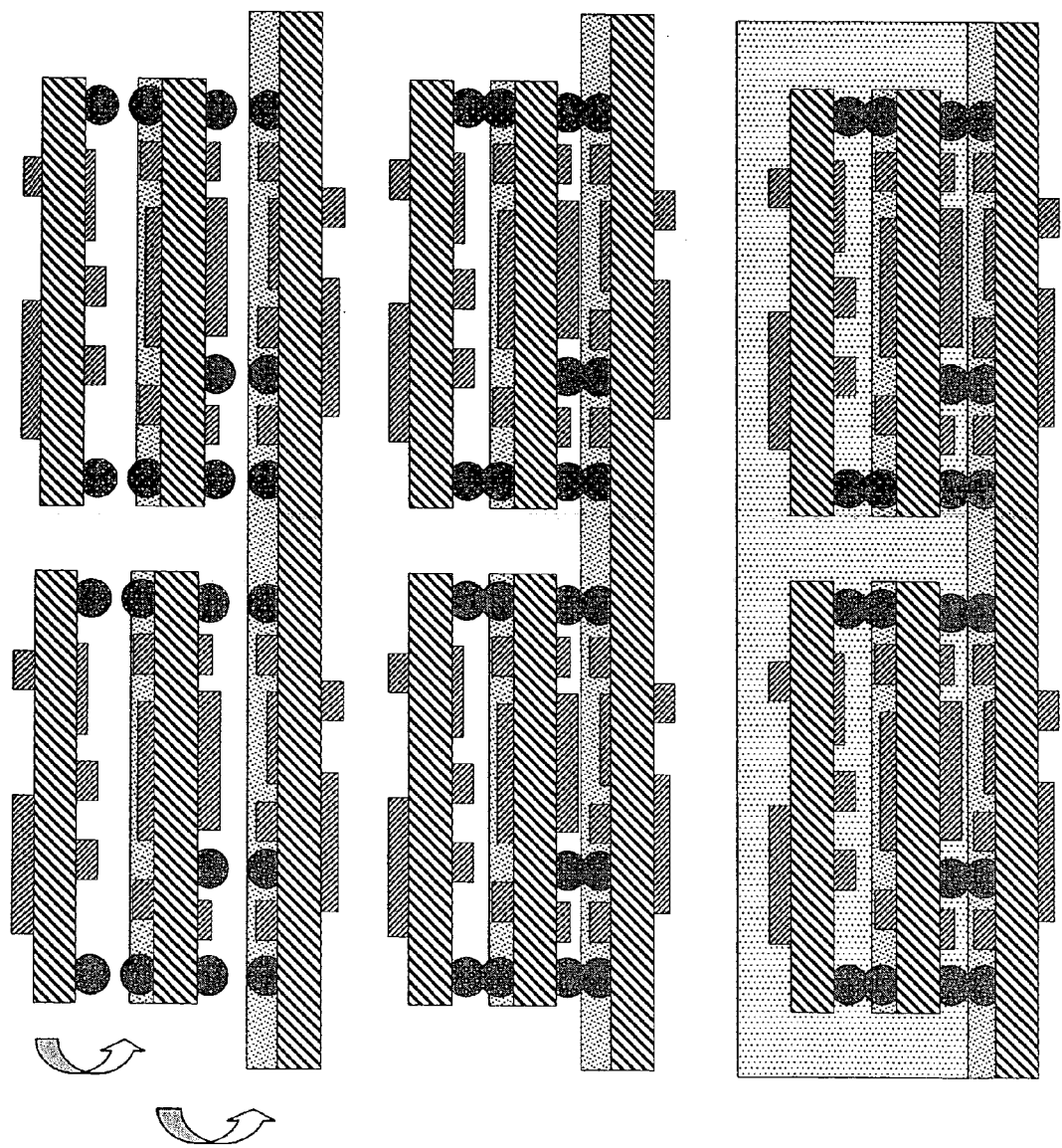
FIGS. 6a and 6b are diagrams showing principle of the SiP substrate stacking: using wafer or substrate as a basis (case of three or more substrates).
Figure 6B:
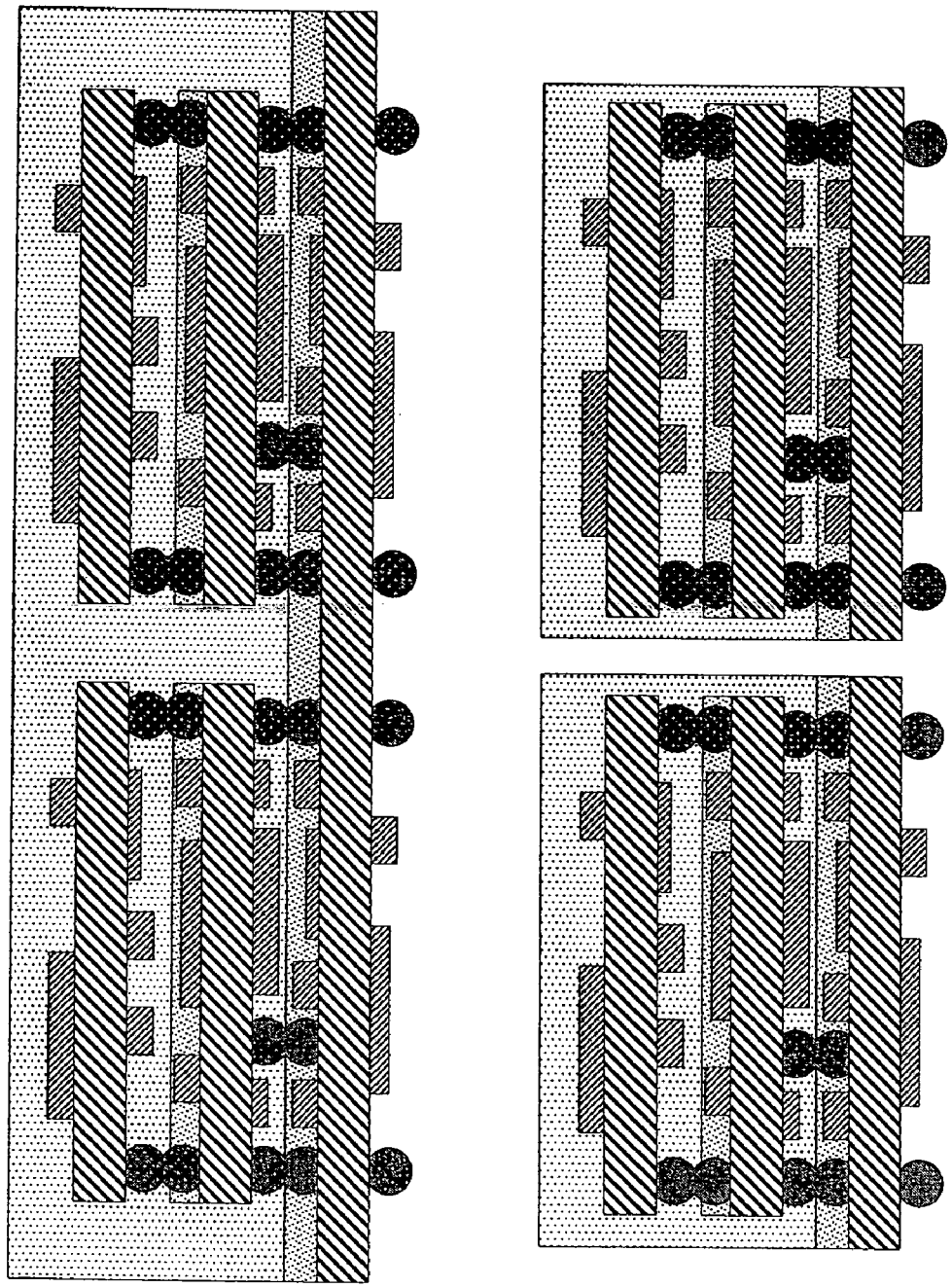

In addition, after mounting the devices, an underfill/overmold operation can be performed, encapsulating all structures by a layer 5, see FIG. 3a and FIG. 6. Standard transfer molding is a preferred option for this process, but also possible is the use of liquid epoxy encapsulants as used for 'glob-top' or 'under-fill' applications, as well as suitable options known to a person of ordinary skill.

Solder balls can be applied to the second main surface of the bottom substrate after this molding step (FIG. 3b), or before.

After this step, dicing the substrate to obtain fully encapsulated 3D-SiP devices can be performed.

Figure 4:
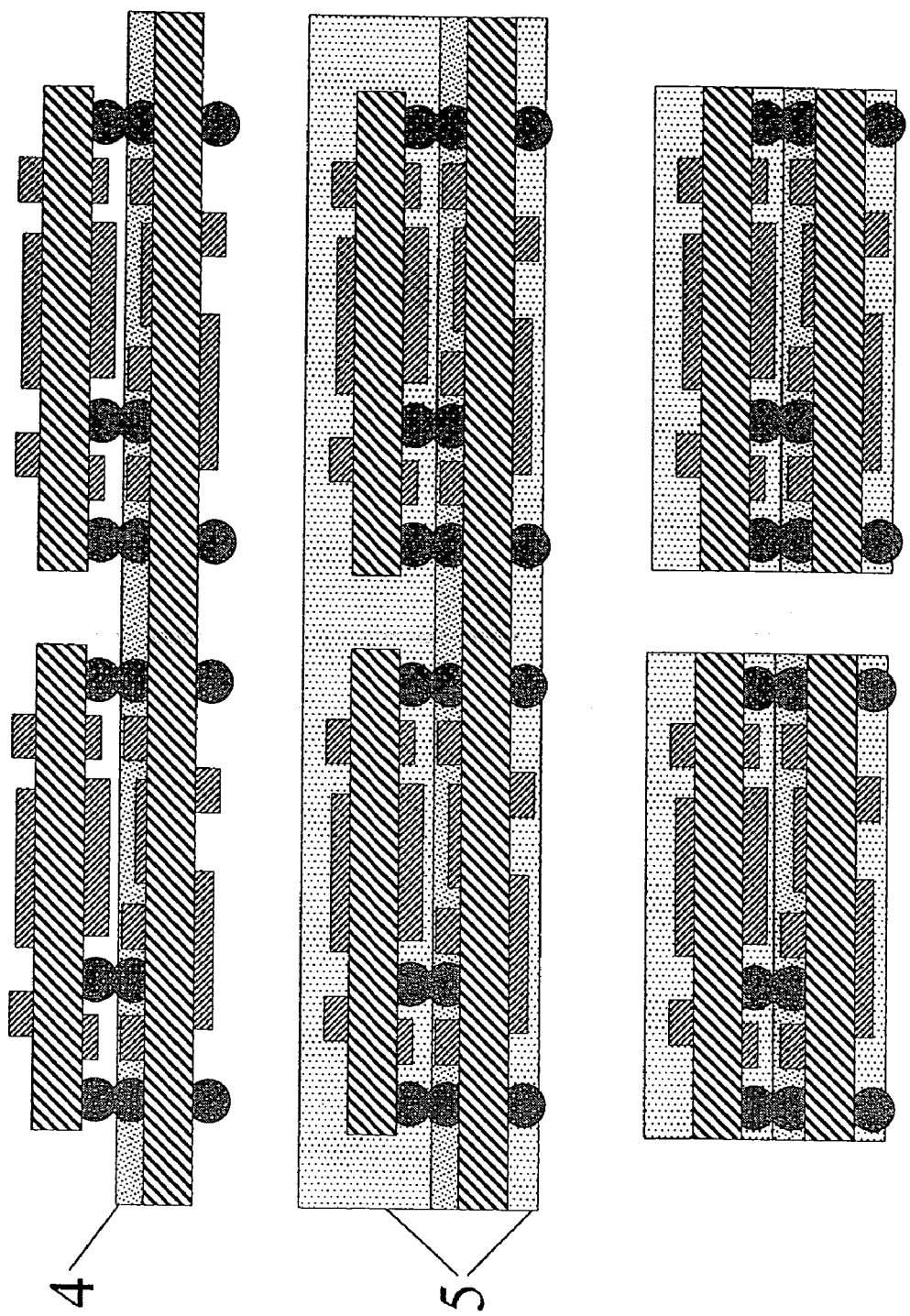

In FIG. 4 further embodiments according to the present invention are illustrated. Here, solder balls are provided to the second main surface of the bottom substrate before the molding step, Molding is performed on both sides of the substrate (see layers 5 in FIG. 4), however, leaving the tips of the bottom solder balls partially free. This module can be used as land-grid array type package, or a second solder ball can be applied on the bottom for improved thermo-mechanical reliability after assembly to a motherboard.

Figure 5:
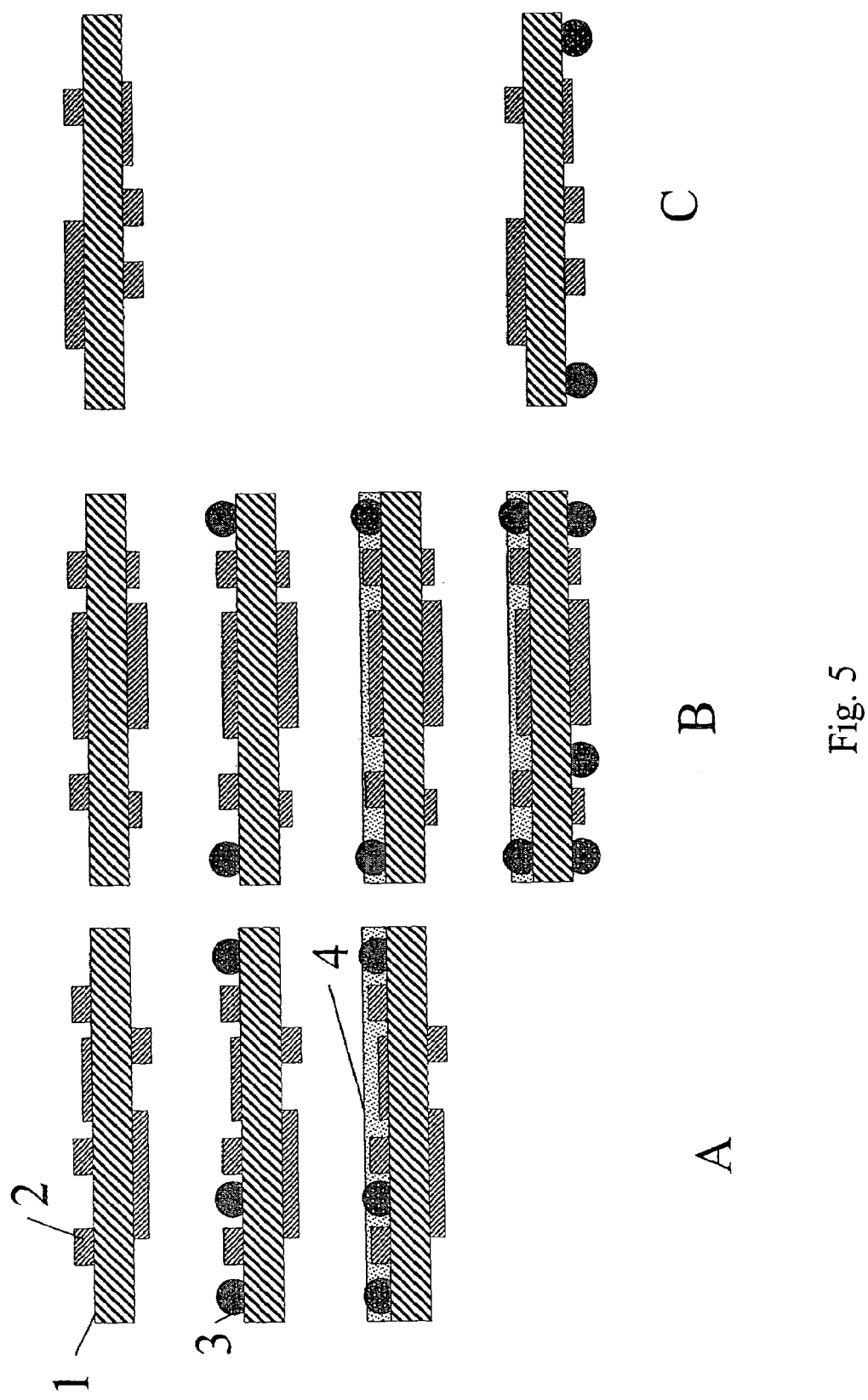

In FIGS. 5 and 6 other embodiments according to the present invention are depicted. The preparation and stacking of SiP devices for 3D stacking in the case of three or more samples is shown.

These embodiments are similar to those of FIG. 1 to FIG. 4, regarding the preparation of the bottom (sequence A) and top (sequence C) substrates. However, the substrate or substrates in the middle (sequence B) are receiving solder balls on both sides.

In certain embodiments, a reflow step can be applied at each bonding process between two elements. In other embodiments, the same solder reflow step can be applied for bonding all elements in a stack. In certain embodiments, N reflow steps are performed for bonding M elements, with N<M−1, for M>2.

Figure 7:
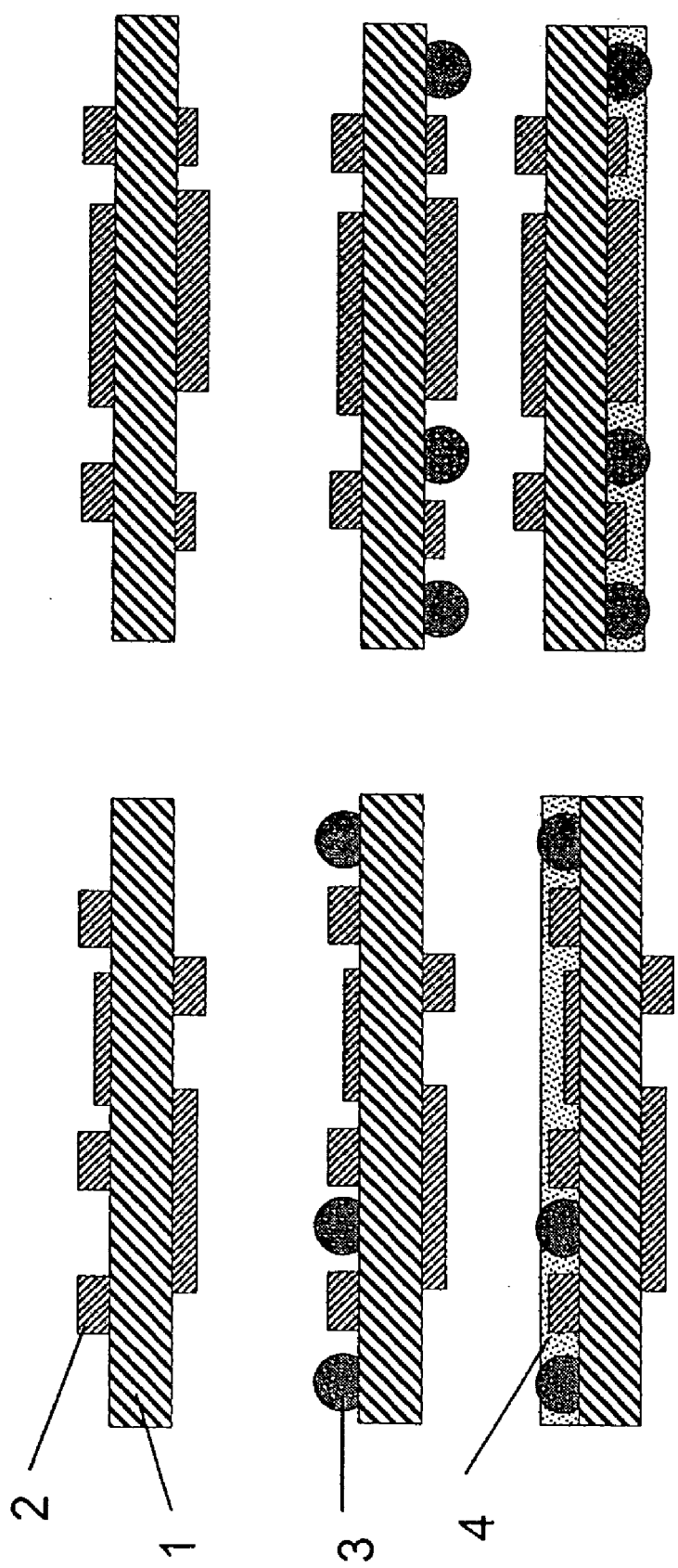
In FIG. 7 to FIG. 9, further embodiments according to the present invention are illustrated, which are similar to the embodiments of FIG. 1 to FIG. 6, but wherein both solder balls which are to be joined are both partially embedded in a non-conductive material as described in detail in the description.
Figure 8:
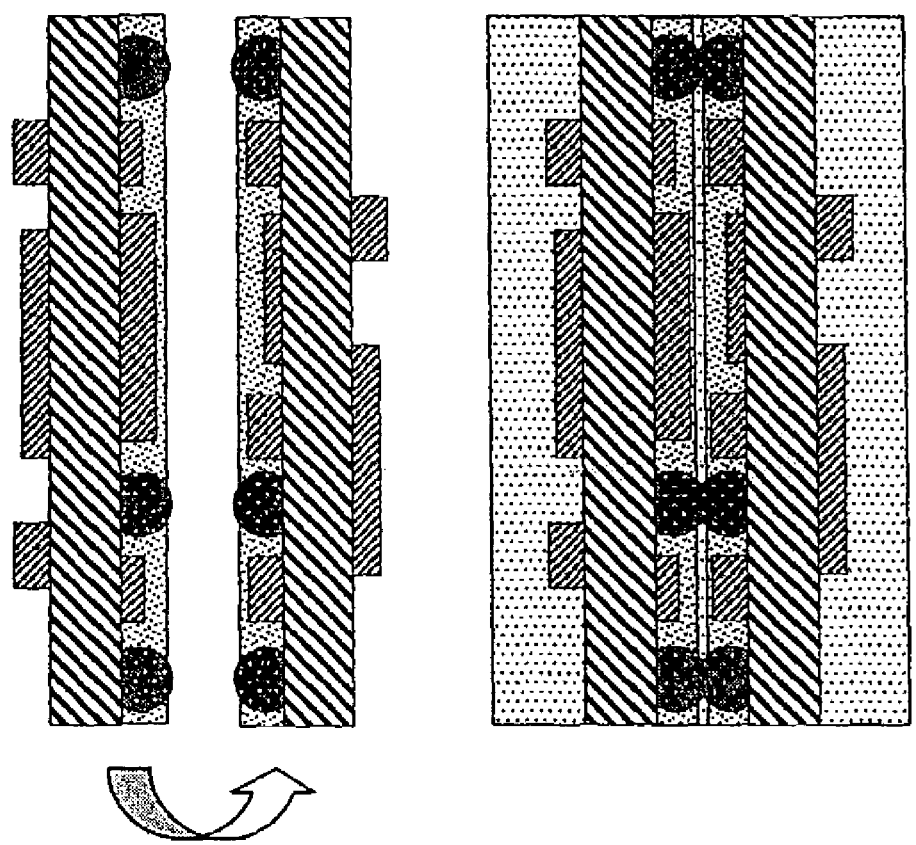
Figure 9:
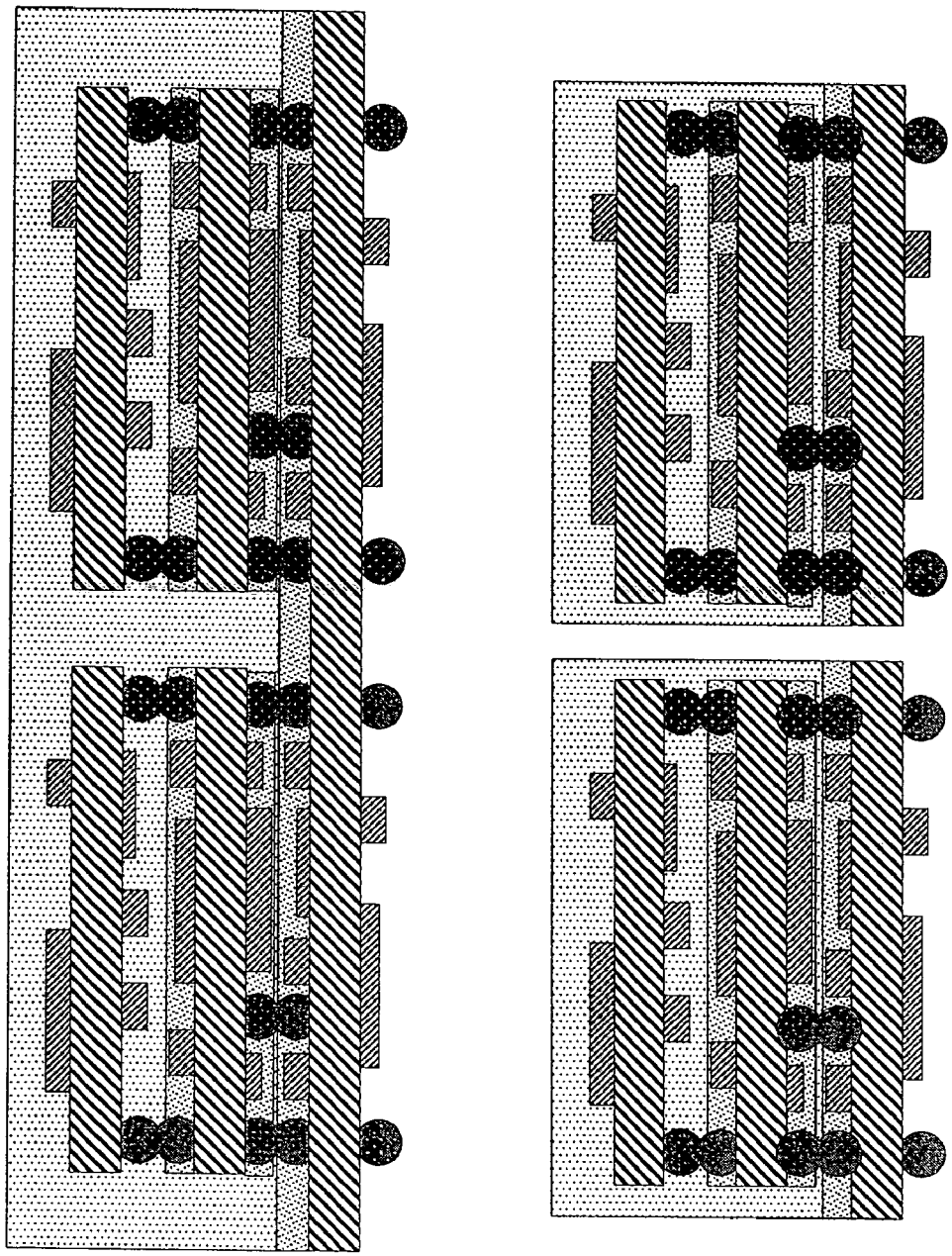

In FIG. 7 to FIG. 9, further embodiments according to the present invention are illustrated, which are similar to the embodiments of FIG. 1 to FIG. 6, but wherein both solder balls respectively attached to the a first main surface of a first element and a first main surface of a second element are both embedded laterally up to respectively level L and L', which are below the respective levels H and H' of the top surface of the respective solder balls. (see FIG. 10 where a generic representation is given of a solder ball or structure on a first main surface of an element and the height parameters L and H are indicated).

Such structures can be used in the bonding of two, three or more SiP levels. For each couple to be joined, solder balls on at least one element, or optionally both elements, can be embedded laterally by a non-conductive material. This choice depends on the requirements, typically spacing between two SiP level—requirements, of a specific structure.

Figure 11:
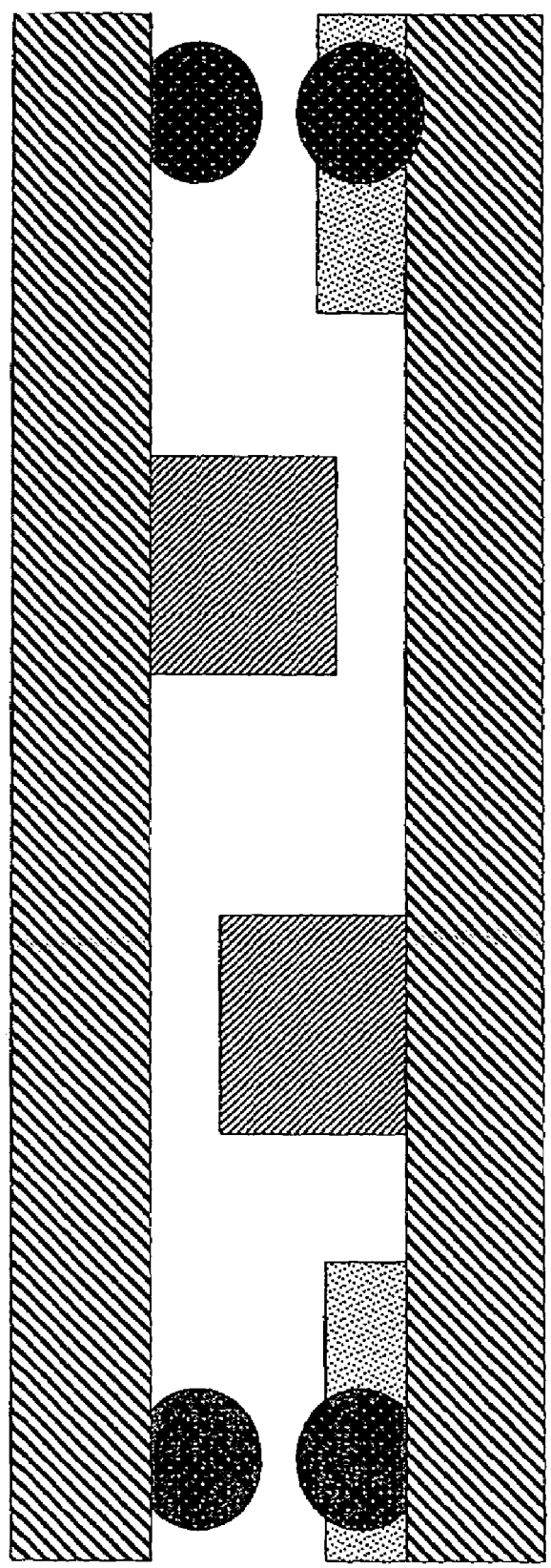
FIG. 11 is a diagram showing an embodiment having exclusion areas and offset components.
Figure 12:
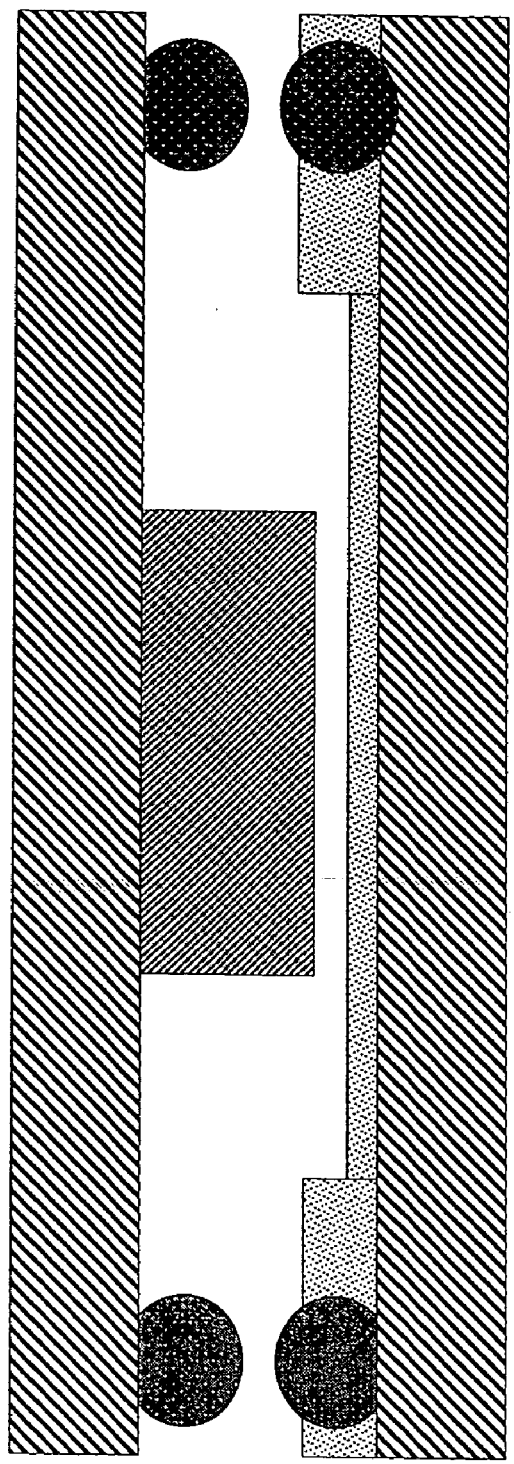
FIG. 12 is a diagram showing an embodiment having recesses.
Figures 13A, 13B:
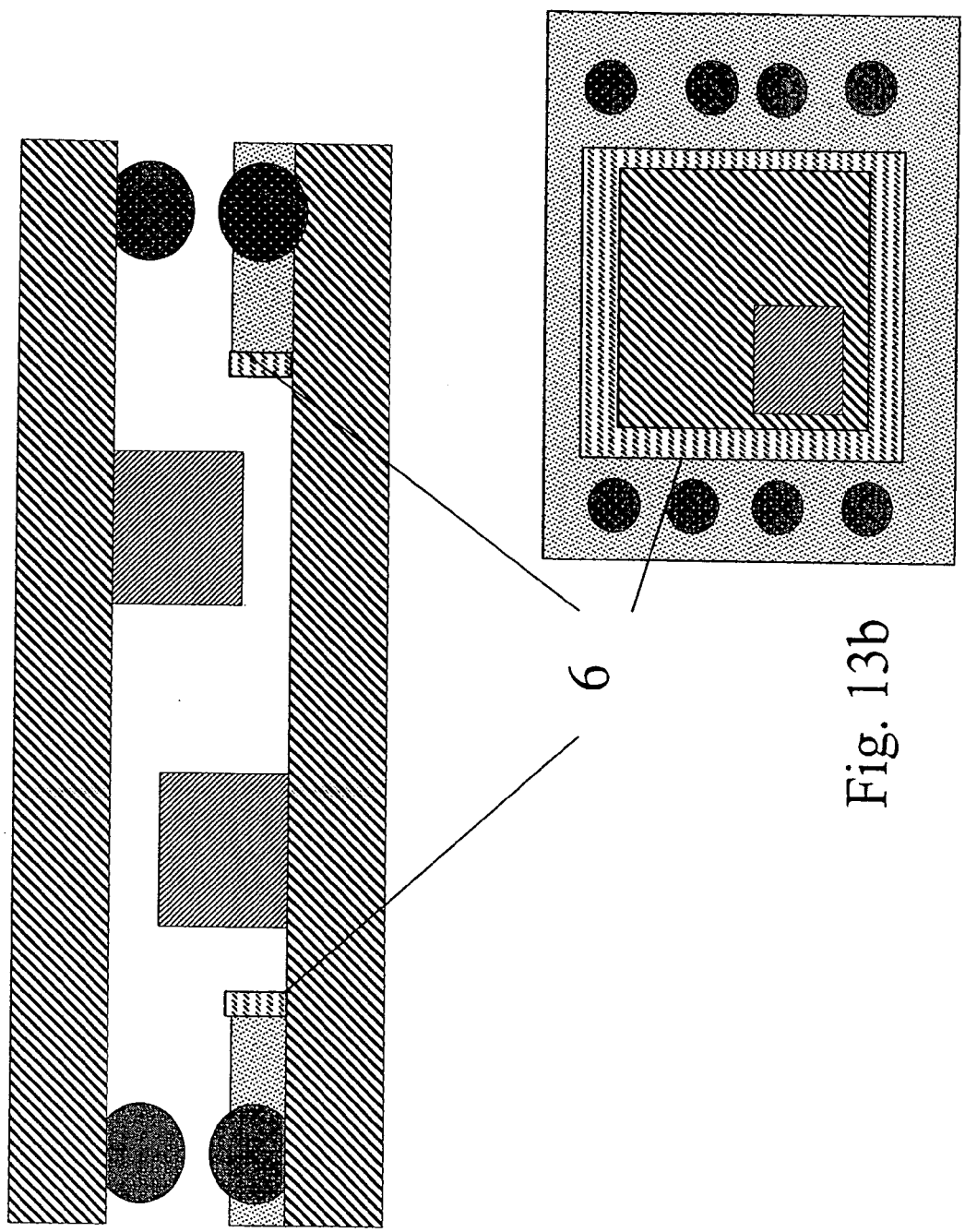
FIGS. 13a and 13b are diagrams showing an embodiment having exclusion areas and confinement structures corresponding to the exclusion areas.
Figure 14:
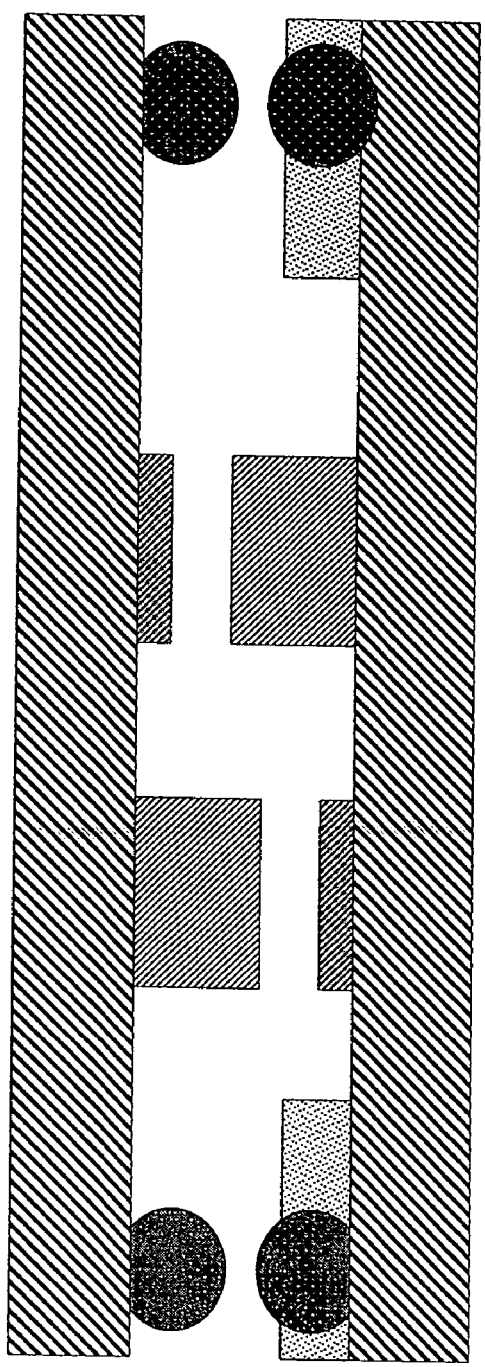
FIG. 14 is a diagram showing an embodiment having exclusion areas with varying height components.

In certain embodiments the first main surface of the first element and/or the first main surface of the second element comprise components or structures which have a topology that extends outwards from the respective main surfaces, and whereby the first and the second solder balls are such that the height of at least one of the components and/or structures on the first main surface of the first element and/or the first main surface of the second element is smaller then the height of the joined solder ball structure, but higher than the solder balls on the corresponding main surface. These embodiments can be achieved by providing preformed embedding layers which for instance include exclusion areas (see e.g., FIG. 11, FIG. 13a, FIG. 13b and FIG. 14), or recesses (see e.g., FIG. 12), i.e., areas in which no or only a thinner layer of nonconductive material is present respectively. FIG. 11 shows an embodiment having exclusion areas and offset components. FIG. 12 shows an embodiment having recesses. FIGS. 13a and 13b show an embodiment having exclusion areas and confinement structures corresponding to the exclusion areas. FIG. 14 shows an embodiment having exclusion areas with varying height components. Such embedding layers which comprise exclusion areas or recesses can be produced by transfer molding or injection molding techniques. Also a glob-top technique whereby a liquid encapsulant is applied can be used. The presence of additional confinement structures 6 (e.g., see FIG. 13), which provide enclosures corresponding to exclusion areas, may be necessary, such that no non-conductive solder ball embedding material can enter the exclusion area. Such confinement structures are not always necessary; molding techniques can also be used which provide exclusion areas. In embodiments whereby exclusion areas are provided on both main surfaces (or similar whereby an embedding layer is only present on one main surface only and comprises an exclusion area), which moreover overlap, and in which on both main surfaces in the respective exclusion area, components are provided, special care should further be taken in the positioning of the components on the first main surfaces, such that components present on the first main surface of a first element are not blocked by components mounted on the first main surface of the second element when both elements are to be bound. This can be achieved by combining lower height components on a first main surface of a first element, with higher height components on a main surface of a second element (e.g., see FIG. 14), or by misaligning the components on the first and second main surfaces on the first and second elements respectively (e.g., see FIG. 11). The combined height of the two components should though be smaller then the joined solder ball structure. It should further be understood that lower and higher components in an exclusion area on a first main surface of a first element can be combined with higher and lower components respectively in an exclusion area on a second main surface of a second element. Such embodiments are shown in FIG. 14.

Applications of the Technology

In one application of the technology, a wireless communication and health monitoring system comprises at least one first wearable apparatus, for measuring patient signs on at least one part of the patient body, for processing the measured patient signs and wirelessly transmitting the processed patient signs, and at least one second apparatus for wirelessly receiving the processed patient signs transmitted by the first apparatus.

In an embodiment a plurality of the first wearable apparatus are found within the system. With a Medium Access Protocol (for instance S-MAC) sharing of the wireless channel between the different wearable apparatus is arranged.

In an embodiment thereof, the first wearable apparatus is capable to place itself in a low power (sleep) mode and to activate itself at the time it estimates that its time slot for communication becomes available. Substantial energy savings can be obtained in the case of low data rate communication.

The second apparatus can be a system comprising an instruction set processor and a radio interface (like USB, for instance arranged as an USB stick in a computer system) for interacting directly with the first apparatus. Further the second apparatus can have a wired data connection, for instance towards the Internet.

The first wearable apparatus may be a medical sensor apparatus comprising an sensor for detecting patients signs on at least a part of the patient body; a processing means for processing the measured patient signs (for instance an analog to digital converter for converting physical measurements into a digital form); a packaged antenna and means for transmitting radio frequency signals; and a thin film battery for providing power to the medical sensor apparatus.

The apparatus can further include analog processing, for instance pre-amplifiers.

The apparatus can further include computation engines for digital processing (like a DSP processor).

The sensor is a sensor adapted for measuring a predetermined class of signs. For instance the predetermined class can be EEG (electroencephalogram) EMG (electromyoelectrogram) and ECG (electrocardiogram). The sensor is then an EMG or and ECG sensor. The sensor for detecting patient signs can be at least one electrode arranged such that the electrode receives a voltage (compared to a reference electrode). The sensor should be operatively associatable with the patient's body.

The radio frequency signal transmitter and the antenna form the radio or RF device. The radio can be a Nordic nRF2401 with 2.4 GHz center frequency, GFSK modulation, 1 MBit/s data rate and 0 dBm output power. The antenna can be a folded dipole antenna. The computation engine can be a TI MSP430 with an 8 MIPS microcontroller and 0.5 mW/MIP.

Figure 15:
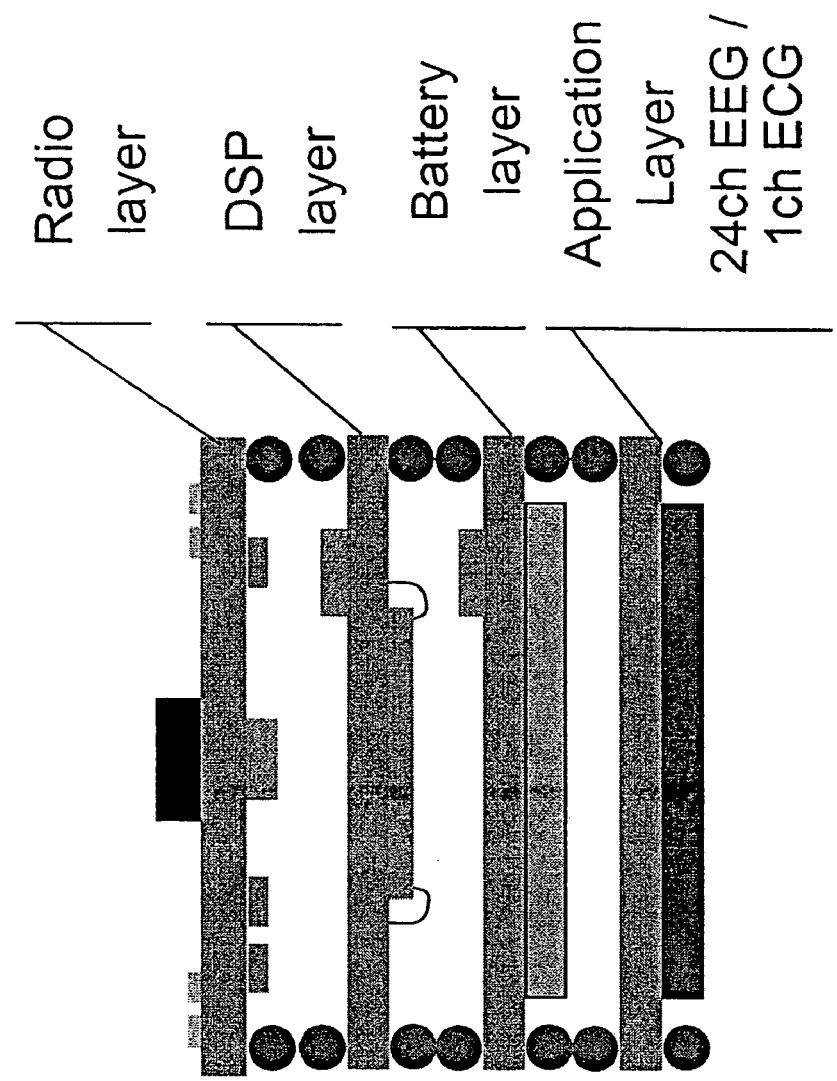
FIG. 15 is a diagram of one embodiment of a 3D stack for a medical application.

In an embodiment, the radio and the digital processing means are integrated in a three dimensional stack (also called 3D stack). FIG. 15 shows a 3D stack. The upper part of the stack is the radio, while the processing means is the middle part of the stack. The analog processing components can be mounted on the same substrate as the 3D stack.

In another application of the technology, a wireless communication and health monitoring system may include the following components:

A radio and an antenna layer. The radio can be a commercially available low power radio or an Ultra Wide-Band low power transmitter.
  A DSP layer. The DSP layer can be a low power 8 MIPS (million instructions per second ) TI MSP430. The DSP unit can also be a low power processor or a dedicated processing ASIC
  a battery layer. The battery layer can be a thin film battery. The battery can be a standard NiMH or Lithium battery.
  An application specific layer. The application specific layer can be a wireless medical sensor apparatus. The application specific layer is determined by the specific application of the wireless communication and health monitoring system. The application can be EEG or ECG layer.

The term "layer" refers to a means having a predetermined functionality. The layer can comprise at least one component.

A high level of integration is achieved through stacking of layers with different functionality. The layers are connected to the neighboring layers by solder balls, wires, bind pads or other bonding means known by a person skilled in the art. In an embodiment, the layers are connected through a dual row of fine pitch solder balls. The bottom layer has a ball grid array footprint, allowing module mounting. This stacking technique allows any kind of module built-up; each layer can have a different functionality such as computing, wireless communication, sensing, power scavenging.

Figure 16:
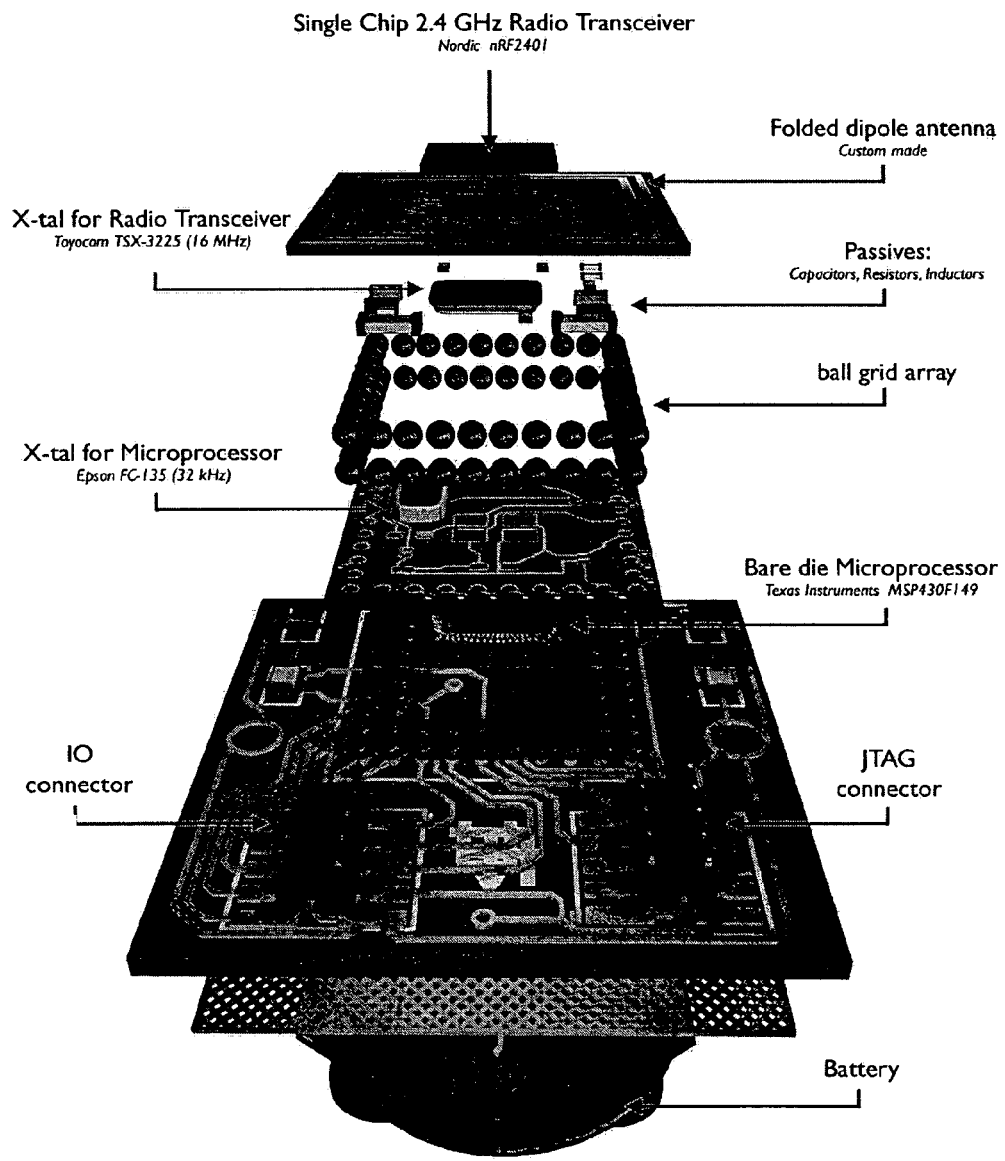
FIG. 16 is a diagram of another embodiment of a 3D stack.

The wireless communication and health monitoring system is represented in FIG. 15, or alternatively in FIG. 16.

The performance of a small antenna (bandwidth and efficiency) is fundamentally limited by the total occupied electric volume of the antenna. An antenna should therefore be as large as possible for good performance. In general, an antenna can only be made smaller by increasing its operating frequency. Circuits (for the purpose of this disclosure also called "electronic component") however decrease in size with improved IC technology even for the same operating frequency. The circuits therefore consume an increasingly smaller part of the complete RF device with improved IC technologies. An integrated antenna should therefore use the maximum volume of the RF module while still avoiding coupling with the RF circuits. Aspects of the invention include an integrated antenna.

An embodiment of the invention is a RF device (for the purpose of this disclosure also called "device") formed by at least two elements:

1) An antenna (for the purpose of this disclosure also called "first antenna element") used for excitation of the radiation and placed outside a shield that encloses the circuits.

2) A shield (for the purpose of this disclosure also called "shielding layer") on which currents are excited by the antenna. The shield protects the circuits from the outside radiation while forming an integral part of the device.

The shield forms an integral part of the design of the communication device as opposed to the state-of-the-art where for the situation of an antenna placed above circuit, the shielding layer is a flat plate. The design freedom is thus limited to the substrate choice and the shape of the excitation antenna. For the situation where the antenna is placed next to circuit, the antenna and shielding layers need to be separated far enough to avoid mutual influence.

The RF device, as for example shown in FIG. 16, can be used for all wireless devices where the size of the RF circuits becomes sufficiently small compared to the required antenna size. This becomes increasingly important because of the possible downscaling in IC technology. The device size determines the actual useable antenna size and thus the maximum antenna performance (bandwidth and efficiency).

Possible system implementations, which can include embedded solder ball structures as described above and can be fabricated by methods comprising the embedded solder ball methods above, include:

Vertical stacking of rigid boards with proposed antenna and RF circuits on the top layer. Single board layers perform a specific functionality. The complete 3D stack can act as a stand-alone wireless device.

Use of the proposed antenna and RF circuits as part of a larger flexible system. Low frequency, sensor and power elements can be placed outside the actual antenna area.

The antenna can be used in a number of applications including short-range communication devices (WLAN, WPAN, Bluetooth, etc.) and small size wireless sensor nodes. In particular, short range communication can be in a body area network which is used for medical diagnostics/therapeutics, sports monitoring or comfort monitoring. Typical applications include the following.

EEG/ECG/EMG diagnostics: the antenna permits communication of data between a set of electrodes and a display/data processing device which can be a personal digital assistant, a cell phone or computer, for example.

Closed loop chronic disease management: the antenna permits communication of data between a sensor and an actuator. Examples include glucose sensing—insulin dispensing for diabetes, EMG sensing—brain stimulation in tremor suppression.

Fall detection for elderly: the information of a body worn shock sensor is communicated via the antenna to a data forwarding device such as a cell phone or a computer connected to the internet.

Shape of the Antenna

The shape of the antenna can be modified in any way to improve the overall performance of the complete antenna (meaning excitation antenna with shielding layer) while fitting in the area around the shielded circuit. A non-exclusive list of possible antennas includes loop, dipole, folded-dipole and fractal antennas. It should also be noted that the antenna is not necessarily planar.

Shape of the Shield

In various embodiments, the shape of the shielding layer can drastically affect the performance of the device since it forms an integral part of the radiating structure. Various shapes can be used including box and cylinder types. Shielding layers can be completely closed or can be formed by connecting two-dimensional shielding layers with vertical conducting vias. The distance between the vias should be small enough for good shielding performance.

Layer Build-up of the Shielding Layer

The shielding layer can be constructed as a multilayer to improve the antenna performance. The shielding layer can be a standard conductor layer, a conductor with a magnetic layer with a high permeability on top, or a conductor with an artificial Electromagnetic Bandgap (EBG) layer on top. This last structure simulates a magnetic conductor in the operating frequency band. The use of materials with a high permeability or an artificial magnetic conductivity in the operating frequency band can significantly improve the performance of the shielding layer as a radiator.

Use of Antenna in a Larger Antenna System

It should be clear that the proposed device could be used as part of a larger antenna. The larger size antenna can improve the bandwidth and/or directivity of the proposed small size antenna. The directivity can be improved by a lens antenna or a reflector antenna.

Three-dimensional Stack

An RF communication device can be part of a modular stack of functional layers (called a 3D stack). Each layer connects to its neighboring layers through a dual row of fine pitch solder balls. The bottom layer has a Ball Grid Array (BGA) footprint. This stacking allows a flexible module build-up. Each layer can have a dedicated functionality (e.g., computing, wireless communication, sensing, power scavenging) and can be tested individually before assembly. In one embodiment, the 3D stack comprises an 8 MIPS low power microcontroller and a 2.4 GHz transceiver antenna on the top layer of the laminate structure. The solder balls can be part of the integrated antenna.

Conclusion

While the above detailed description has shown, described, and pointed out the fundamental novel features of the invention as applied to various embodiments, it will be understood that various omissions and substitutions and changes in the form and details of the system illustrated may be made by those skilled in the art, without departing from the intent of the invention.

What is claimed is:

1. A method for bonding elements comprising:
producing on a first main surface of a first element a first solder ball;
producing on a first main surface of a second element a second solder ball;
providing a layer of non-conductive material so that the upper part of the first solder ball is not covered;
providing contact between said first solder ball and said second solder ball; and
bonding said first element and said second element by applying a reflow act whereby said solder balls melt and form a joined solder ball structure, wherein said second solder ball is laterally embedded in a non-conductive material, such that the upper part of said second solder ball is not covered by said non-conductive material.

2. The method according to claim 1, wherein said non-conductive material is laterally embedding said first solder ball up to a level parallel to the first main surface and which does not extend above said first solder ball.

3. The method according to claim 1, further comprising applying an underfill material after the bonding between said first main surface of said second element and said first main surface of said first element.

4. The method according to claim 1, wherein said non-conductive material is laterally embedding said second solder ball up to a level parallel to the first main surface and which does not extend above said second solder ball.

5. The method according to claim 1, wherein said non-conductive material further comprises exclusion areas or recesses.

6. The method according to claim 1, wherein said first main surface of said first element and said first main surface of said second element comprise components or structures, and whereby said first and said second solder balls are such that the height of said components or structures is smaller than the height of said first solder ball and said second solder ball respectively.

7. The method according to claim 1, wherein said first main surface of said first element and said first main surface of said second element comprise components or structures which have a topology that extends outwards from the respective main surfaces, and whereby said first and said second solder balls are such that the height of at least one of said components or structures on the first main surface of the first element and the first main surface of the second element is smaller than the height of said joined solder ball structure but larger than the solder balls on the corresponding main surface.

8. The method according to claim 1, further comprising applying an underfill/overmold operation, which fills up the remaining gaps between said elements.

9. The method according to claim 1, wherein said elements are substrates, chips or dies.

10. The method according to claim 1, wherein said non-conductive material further comprises exclusion areas or recesses that do not contain said solder balls.

11. The method according to claim 1, wherein said first main surface of said first element or said first main surface of said second element comprise components or structures, and whereby said first and said second solder balls are such that the height of said components or structures is smaller than the height of said first solder ball and said second solder ball respectively.

12. The method according to claim 1, wherein said first main surface of said first element or said first main surface of said second element comprise components or structures which have a topology that extends outwards from the respective main surfaces, and whereby said first and said second solder balls are such that the height of at least one of said components or structures on the first main surface of the first element or the first main surface of the second element is smaller than the height of said joined solder ball structure but larger than the solder balls on the corresponding main surface.

13. A method for bonding elements comprising:
producing on a first main surface of a first element a first solder ball;
producing on a first main surface of a second element a second solder ball;
providing contact between said first solder ball and said second solder ball; and
bonding said first element and said second element by applying a reflow act whereby said solder balls melt and form a joined solder ball structure,
wherein, prior to the bonding, said first solder ball is laterally embedded in a non-conductive material, such that the upper part of said first solder ball is not covered by said non-conductive material, and wherein the method is applied an integer number of times, by repetitively bonding a main surface of an element previously bonded by the method to a main surface of a further element.

14. The method according to claim 13, wherein applying an underfill/overmold operation is applied only once for the whole stacked structure.

15. The method according to claim 13, wherein said non-conductive material is laterally embedding said first solder ball up to a level parallel to the first main surface and which does not extend above said first solder ball.

16. The method according to claim 13, further comprising applying an underfill material after the bonding between said first main surface of said second element and said first main surface of said first element.

17. The method according to claim 13, wherein said second solder ball is laterally embedded in a non-conductive material, such that the upper part of said second solder ball is not covered by said non-conductive material.

18. The method according to claim 17, wherein said non-conductive material is laterally embedding said second solder ball up to a level parallel to the first main surface and which does not extend above said second solder ball.

19. The method according to claim 13, wherein said non-conductive material further comprises exclusion areas or recesses.

20. The method according to claim 13, wherein said first main surface of said first element and said first main surface of said second element comprise components or structures, and whereby said first and said second solder balls are such that the height of said components or structures is smaller than the height of said first solder ball and said second solder ball respectively.

21. The method according to claim 13, wherein said first main surface of said first element or said first main surface of said second element comprise components or structures, and whereby said first and said second solder balls are such that the height of said components or structures is smaller than the height of said first solder ball and said second solder ball respectively.

22. The method according to claim 13, wherein said first main surface of said first element and said first main surface of said second element comprise components or structures which have a topology that extends outwards from the respective main surfaces, and whereby said first and said second solder balls are such that the height of at least one of said components or structures on the first main surface of the first element and the first main surface of the second element is smaller than the height of said joined solder ball structure but larger than the solder balls on the corresponding main surface.

23. The method according to claim 13, wherein said first main surface of said first element or said first main surface of said second element comprise components or structures which have a topology that extends outwards from the respective main surfaces, and whereby said first and said second solder balls are such that the height of at least one of said components or structures on the first main surface of the first element or the first main surface of the second element is smaller than the height of said joined solder ball structure but larger than the solder balls on the corresponding main surface.

24. A method for bonding elements comprising:
producing on a first main surface of a first element a first solder ball;
producing on a first main surface of a second element a second solder ball;
providing contact between said first solder ball and said second solder ball; and
bonding said first element and said second element by applying a reflow act whereby said solder balls melt and form a joined solder ball structure,
wherein, prior to the bonding, said first solder ball is laterally embedded in a non-conductive material, such that the upper part of said first solder ball is not covered by said non-conductive material, and wherein said first main surface of said first element and said first main surface of said second element comprise components or structures, and whereby said first and said second solder balls are such that the height of said components or structures is smaller than the height of said first solder ball and said second solder ball respectively.

25. The method according to claim 24, wherein said non-conductive material is laterally embedding said first solder ball up to a level parallel to the first main surface and which does not extend above said first solder ball.

26. The method according to claim 24, wherein said second solder ball is laterally embedded in a non-conductive material, such that the upper part of said second solder ball is not covered by said non-conductive material.

27. The method according to claim 26, wherein said non-conductive material is laterally embedding said second solder ball up to a level parallel to the first main surface and which does not extend above said second solder ball.

28. The method according to claim 24, wherein said non-conductive material further comprises exclusion areas or recesses.

29. The method according to claim 24, wherein said first main surface of said first element and said first main surface of said second element comprise components or structures which have a topology that extends outwards from the respective main surfaces, and whereby said first and said second solder balls are such that the height of at least one of said components or structures on the first main surface of the first element and the first main surface of the second element is smaller than the height of said joined solder ball structure but larger than the solder balls on the corresponding main surface.

30. The method according to claim 24, wherein said first main surface of said first element or said first main surface of said second element comprise components or structures which have a topology that extends outwards from the respective main surfaces, and whereby said first and said second solder balls are such that the height of at least one of said components or structures on the first main surface of the first element or the first main surface of the second element is smaller than the height of said joined solder ball structure but larger than the solder balls on the corresponding main surface.

31. A method for bonding elements comprising:
producing on a first main surface of a first element a first solder ball;
producing on a first main surface of a second element a second solder ball;
providing contact between said first solder ball and said second solder ball; and
bonding said first element and said second element by applying a reflow act whereby said solder balls melt and form a joined solder ball structure,
wherein, prior to the bonding, said first solder ball is laterally embedded in a non-conductive material, such that the upper part of said first solder ball is not covered by said non-conductive material, and wherein said first main surface of said first element or said first main surface of said second element comprise components or structures, and whereby said first and said second solder balls are such that the height of said components or structures is smaller than the height of said first solder ball and said second solder ball respectively.

32. The method according to claim 31, wherein said non-conductive material is laterally embedding said first solder ball up to a level parallel to the first main surface and which does not extend above said first solder ball.

33. The method according to claim 31, further comprising applying an underfill material after the bonding between said first main surface of said second element and said first main surface of said first element.

34. The method according to claim 31, wherein said second solder ball is laterally embedded in a non-conductive material, such that the upper part of said second solder ball is not covered by said non-conductive material.

35. The method according to claim 34, wherein said non-conductive material is laterally embedding said second solder ball up to a level parallel to the first main surface and which does not extend above said second solder ball.

36. The method according to claim 31, wherein said non-conductive material further comprises exclusion areas or recesses.

37. The method according to claim 31, wherein said first main surface of said first element and said first main surface of said second element comprise components or structures which have a topology that extends outwards from the respective main surfaces, and whereby said first and said second solder balls are such that the height of at least one of said components or structures on the first main surface of the first element and the first main surface of the second element is smaller than the height of said joined solder ball structure but larger than the solder balls on the corresponding main surface.

38. The method according to claim 31, wherein said first main surface of said first element or said first main surface of said second element comprise components or structures which have a topology that extends outwards from the respective main surfaces, and whereby said first and said second solder balls are such that the height of at least one of said components or structures on the first main surface of the first element or the first main surface of the second element is smaller than the height of said joined solder ball structure but larger than the solder balls on the corresponding main surface.

39. A method for bonding elements comprising:
producing on a first main surface of a first element a first solder ball;
producing on a first main surface of a second element a second solder ball;
providing contact between said first solder ball and said second solder ball; and
bonding said first element and said second element by applying a reflow act whereby said solder balls melt and form a joined solder ball structure,
wherein, prior to the bonding, said first solder ball is laterally embedded in a non-conductive material, such that the upper part of said first solder ball is not covered by said non-conductive material, and wherein said first main surface of said first element and said first main surface of said second element comprise components or structures which have a topology that extends outwards from the respective main surfaces, and whereby said first and said second solder balls are such that the height of at least one of said components or structures on the first main surface of the first element and the first main surface of the second element is smaller than the height of said joined solder ball structure but larger than the solder balls on the corresponding main surface.

40. The method according to claim 39, wherein said non-conductive material is laterally embedding said first solder ball up to a level parallel to the first main surface and which does not extend above said first solder ball.

41. The method according to claim 39, wherein said second solder ball is laterally embedded in a non-conductive material, such that the upper part of said second solder ball is not covered by said non-conductive material.

42. The method according to claim 41, wherein said non-conductive material is laterally embedding said second solder ball up to a level parallel to the first main surface and which does not extend above said second solder ball.

43. The method according to claim 39, wherein said non-conductive material further comprises exclusion areas or recesses.

44. The method according to claim 39, wherein said first main surface of said first element and said first main surface of said second element comprise components or structures, and whereby said first and said second solder balls are such that the height of said components or structures is smaller than the height of said first solder ball and said second solder ball respectively.

45. The method according to claim 39, wherein said first main surface of said first element or said first main surface of said second element comprise components or structures, and whereby said first and said second solder balls are such that the height of said components or structures is smaller than the height of said first solder ball and said second solder ball respectively.

46. A method for bonding elements comprising:
producing on a first main surface of a first element a first solder ball;
producing on a first main surface of a second element a second solder ball;
providing contact between said first solder ball and said second solder ball; and
bonding said first element and said second element by applying a reflow act whereby said solder balls melt and form a joined solder ball structure,
wherein, prior to the bonding, said first solder ball is laterally embedded in a non-conductive material, such that the upper part of said first solder ball is not covered by said non-conductive material, and wherein said first main surface of said first element or said first main surface of said second element comprise components or structures which have a topology that extends outwards from the respective main surfaces, and whereby said first and said second solder balls are such that the height of at least one of said components or structures on the first main surface of the first element or the first main surface of the second element is smaller than the height of said joined solder ball structure but larger than the solder balls on the corresponding main surface.

47. The method according to claim 46, wherein said non-conductive material is laterally embedding said first solder ball up to a level parallel to the first main surface and which does not extend above said first solder ball.

48. The method according to claim 46, wherein said second solder ball is laterally embedded in a non-conductive material, such that the upper part of said second solder ball is not covered by said non-conductive material.

49. The method according to claim 48, wherein said non-conductive material is laterally embedding said second solder ball up to a level parallel to the first main surface and which does not extend above said second solder ball.

50. The method according to claim 46, wherein said non-conductive material further comprises exclusion areas or recesses.

51. The method according to claim 46, wherein said first main surface of said first element and said first main surface of said second element comprise components or structures, and whereby said first and said second solder balls are such that the height of said components or structures is smaller than the height of said first solder ball and said second solder ball respectively.

52. The method according to claim 46, wherein said first main surface of said first element or said first main surface of said second element comprise components or structures, and whereby said first and said second solder balls are such that the height of said components or structures is smaller than the height of said first solder ball and said second solder ball respectively.

* * * * *

UNITED STATES PATENT AND TRADEMARK OFFICE
CERTIFICATE OF CORRECTION

| | | |
|---|---|---|
| PATENT NO. | : 7,205,177 B2 | Page 1 of 1 |
| APPLICATION NO. | : 11/171483 | |
| DATED | : April 17, 2007 | |
| INVENTOR(S) | : Eric Beyne | |

It is certified that error appears in the above-identified patent and that said Letters Patent is hereby corrected as shown below:

On the Title Page, Item (75), it is hereby certified that the correct inventorship of this patent should read:

Eric Beyne, Leuven (BE)

Signed and Sealed this
Twenty-eighth Day of February, 2012

David J. Kappos
*Director of the United States Patent and Trademark Office*